United States Patent [19]
Sigmon et al.

[11] Patent Number: 6,084,468
[45] Date of Patent: Jul. 4, 2000

[54] METHOD AND APPARATUS FOR HIGH EFFICIENCY WIDEBAND POWER AMPLIFICATION

[75] Inventors: Bernard Eugene Sigmon, Gilbert, Ariz.; Frederick H. Raab, Colchester, Vt.; James Roger Clark, II, Phoenix, Ariz.

[73] Assignee: Motorola, Inc., Schaumburg, Ill.

[21] Appl. No.: 08/944,585

[22] Filed: Oct. 6, 1997

[51] Int. Cl.[7] .................................................. H03G 3/30
[52] U.S. Cl. .................. 330/136; 330/10; 330/207 A; 330/251; 330/297
[58] Field of Search .................. 330/10, 136, 207 A, 330/251, 297

[56] References Cited

U.S. PATENT DOCUMENTS

| | | | |
|---|---|---|---|
| 3,720,880 | 3/1973 | Le Seigneur | 330/29 |
| 4,346,349 | 8/1982 | Yokoyama | 330/10 |
| 5,121,084 | 6/1992 | Anderson et al. | 330/295 |
| 5,251,330 | 10/1993 | Chiba et al. | 455/91 |
| 5,861,777 | 1/1999 | Sigmon et al. | 330/136 |

FOREIGN PATENT DOCUMENTS

| | | | |
|---|---|---|---|
| 0476908 | 9/1991 | European Pat. Off. | H03F 3/68 |

OTHER PUBLICATIONS

An article entitled "A Linear Transponder For Amateur Radio Satellites" by Dr. K. Meinzer, DJ 4ZC from VHG Communications, vol. 7, Jan. 1975.

An article entitled "High–Efficiency Single–Sideband HF/VHF Transmitter Based Upon Envelope Elimination And Restoration " by F.H. Raab and D.J. Rupp, Green Mountain Radio Research Company, USA from IEEE CP392, UK pp. 21–25, Jul. 4–7, 1994.

An article entitled "Class–S High–Efficiency Amplitude Modulator" by Dr. Frederick H. Raab and D.J. Rupp, Green Mountain Radio Research from GMRR TP93–1:RF Design, vol. 17.No. 5. pp. 70–74, May 1994.

An article entitled "Single–Sideband Transmission By Envelope Elimination and Restoration" by Leonard R. Kahn from Proceedings Of The IRE. July, year unknown.

Article entitled "Intermodulation Distortion in Kahn–Technique Transmitters" by Frederick H. Raab, IEEE Transactions On Microwave Theory and Techniques, vol. 44, No. 12, (Dec. 1996).

*Primary Examiner*—Michael B Shingleton
*Attorney, Agent, or Firm*—Dana B. LeMoine; Timothy J. Lorenz

[57] ABSTRACT

A method and apparatus for efficient power amplification of a wideband signal with a correspondingly wide modulation bandwidth includes an envelope detector (220), an adaptive split band modulator (270), and a power amplifier (260). The adaptive split band modulator (270) amplifies the low frequency components using a class S modulator (760), and amplifies the high frequency components using a class B amplifier (750). The power supply of the class B amplifier (750) is adaptively modified as a function of the amplitude of the signal that it amplifies. In this manner, the class B amplifier (750) operates at a higher efficiency.

12 Claims, 3 Drawing Sheets

METHOD AND APPARATUS FOR HIGH
EFFICIENCY WIDEBAND POWER
AMPLIFICATION

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Communications devices, which often transmit wideband signals, are an example of an application where these qualities are in demand. Low distortion allows the communications devices to communicate more reliably, and high efficiency allows the devices to operate longer on a single battery.

Wideband communications signals usually have correspondingly wide modulation bandwidths. That is, when a signal occupies a large RF bandwidth, the envelope of the signal within that bandwidth is rapidly changing. An amplifier that efficiently amplifies a signal of this type preferably has a wide RF bandwidth and a wide modulation bandwidth.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

In EER-type amplifiers the envelope signal occupying the modulation bandwidth is amplified in the amplitude path. Conventional EER-type amplifiers utilize class S modulators to amplify the modulation bandwidth included in the envelope of the input signal. Unfortunately, class S modulators are limited in bandwidth by the switching frequency at which they operate, and as the switching frequency increases, the class S modulator becomes less efficient. This practical constraint sets a maximum modulation bandwidth achievable for any given amplifier efficiency.

Accordingly, a need exists for a power amplifier that efficiently amplifies a wideband RF signal exhibiting a wide modulation bandwidth.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an amplifier that efficiently amplifies wideband signals with correspondingly wide modulation bandwidths.

Figure 1:
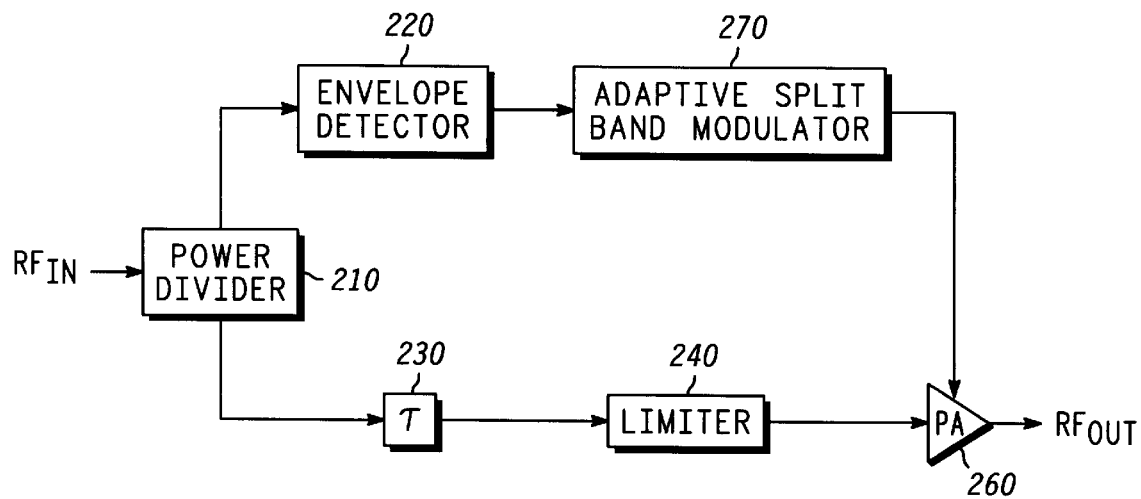
FIG. 1 shows a diagram of an amplifier in accordance with a preferred embodiment of the present invention.

FIG. 1 shows a diagram of an amplifier in accordance with a preferred embodiment of the present invention. EER-type amplifier 10 includes power divider 210, envelope detector 220, adaptive split band modulator 270, time delay element 230, limiter 240, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240 and power amplifier 260. Time delay element 230, which produces a delay equal to that introduced by adaptive split band modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and adaptive split band modulator 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used.

Adaptive split band modulator 270 amplifies the envelope signal output from envelope detector 220 and drives the drain bias of power amplifier 260. Adaptive split band modulator 270 amplifies the envelope signal to a level commensurate with the desired output. The output of adaptive split band modulator 270 is the power supply for power amplifier 260, and the resultant remodulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Figure 2:
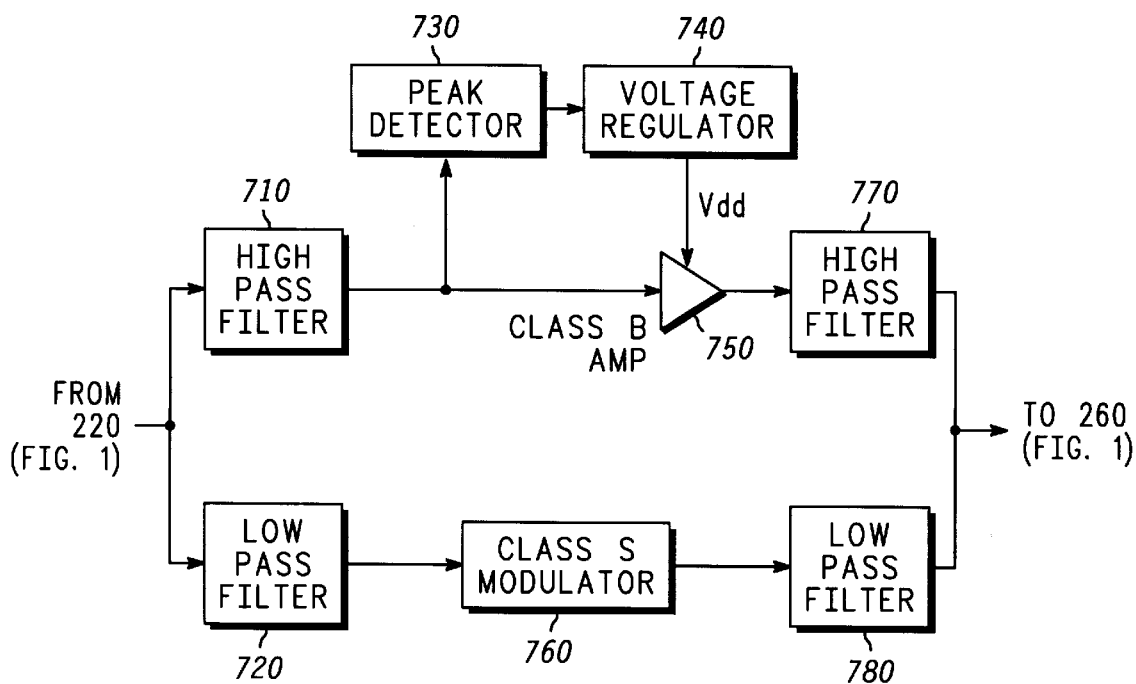
FIG. 2 shows a diagram of an adaptive split band modulator in accordance with a preferred embodiment of the present invention.

FIG. 2 shows a diagram of an adaptive split band modulator in accordance with a preferred embodiment of the present invention. Split band modulators combine at least two amplifiers, each of which amplifies a different bandwidth. In a preferred embodiment, a split band modulator includes two amplifiers, a first amplifier for amplifying the low frequency components, and a second amplifier for amplifying the high frequency components. The first amplifier is one that efficiently amplifies low frequency components, and the second amplifier is one that amplifies the signals above the bandwidth of the first amplifier. The split band modulator is advantageous because it is a wider bandwidth amplifier than the first, efficient, amplifier, and also because it is more efficient than the second, wider bandwidth, amplifier.

In a preferred embodiment as exemplified in FIG. 2, the split band modulator combines a class S modulator as the first amplifier, and a class B amplifier as the second amplifier, to achieve a wider bandwidth than is possible with a class S amplifier alone. The low frequency components of the envelope are amplified efficiently by the class S modulator. The high frequency components are amplified by the class B amplifier and added to the output of the class S modulator. Since the low frequency components constitute most of the power in the envelope, the split band modulator is considerably more efficient than a simple class B amplifier. Adaptive split band modulator 270 includes high pass filter 710, peak detector 730, voltage regulator 740, class B amplifier 750, high pass filter 770, low pass filter 720, class S modulator 760, and low pass filter 780.

Adaptive split band modulator 270 is arranged such that low frequency components of an input signal are amplified separately from high frequency components of the input signal. In a preferred embodiment the low frequency components are separated from the high frequency components using low pass filter 720. The low frequency components output from low pass filter 720 are amplified by class S modulator 760.

Class S modulator 760 efficiently amplifies the low frequency components, creating amplified low frequency components, which are then input to low pass filter 780. At the output of low pass filter 780 is a delayed and amplified version of the low frequency components of the input signal.

The amplification of the low frequency components as just described is performed very efficiently by class S modulator 760. Class S modulator 760 efficiently amplifies the signal by pulsewidth modulating its input, thereby creating a pulsewidth modulated signal, and then filtering the pulsewidth modulated signal to create the output. Because class S modulator 760 includes a pulsewidth modulator which operates as a switching device, it operates more efficiently than a linear amplifier such as a class A or class B amplifier as long as the switching frequency is not excessively high. As previously mentioned, the maximum bandwidth that can be efficiently amplified by class S modulator 760 is a function of, among other things, the switching frequency. In practical applications, the switching frequency of class S modulator is limited, because above a certain switching frequency, class S modulator becomes less efficient and the benefits of using a class S modulator diminish. As a result of the high efficiency of class S modulator 760 within a given bandwidth, it is desirable to amplify as much of the input signal as possible in the lower frequency path of adaptive split band modulator 270.

The high frequency components of the input signal are separated from the low frequency components of the input signal using high pass filter 710. High pass filter 710 outputs the high frequency components, which are then amplified by class B amplifier 750. The output of class B amplifier 750 drives high pass filter 770, and the resulting signal is combined with the low frequency components produced in low pass filter 780.

The filters at the outputs of class S modulator 760 and class B amplifier 750 have a finite delay associated with them. The delays are such that the low frequency components and high frequency components are recombined with like delays so that the result is a high fidelity reproduction of the input. In addition, adaptive split band modulator 270 has a delay associated with its operation as a whole. When adaptive split band modulator 270 is used in an EER-type amplifier to amplify the envelope of a signal, the delay of adaptive split band modulator 270 is compensated for by time delay means in the EER-type amplifier. For example, in the EER-type amplifier embodiment of FIG. 1, the delay of adaptive split band modulator 270 is compensated for by time delay element 230.

Class B amplifiers are, in general, not as efficient as class S modulators. It is desirable, therefore, to reduce the use of class B amplifier 750 as much as possible. In addition, when class B amplifier 750 is being used, it is desirable to maintain operation of class B amplifier 750 in its most efficient operating region, thereby maintaining a high average efficiency. To this end, peak detector 730 detects the amplitude of the high frequency components and drives voltage regulator 740.

In response to the amplitude of the high frequency components, voltage regulator 740 produces the supply voltage for class B amplifier 750. By maintaining the supply voltage of class B amplifier 750 near the peak amplitude of the high frequency components which it amplifies, class B amplifier 750 is maintained in a more efficient operating region. Peak detector 730 and voltage regulator 740 adaptively follow the amplitude of the high frequency components and power class B amplifier 750 accordingly. If little or no high frequency components are present, class B amplifier 750 receives little or no supply voltage, and power is not wasted needlessly biasing class B amplifier 750.

The efficiency of adaptive split band modulator 270 depends upon the fraction of the signal power amplified by each amplifier as well as the peak to average ratio of the part amplified by class B amplifier 750. Both parameters are strongly dependent upon the signal being amplified. When adaptive split band modulator 270 is used to amplify the envelope in an EER-type amplifier, the signal that must be amplified by class B amplifier 750 consists of the high frequency components of the envelope. In general, the peak to average ratio of this signal is as large or larger than that of the envelope itself. Both the amount of power and the peak to average ratio of this signal depend upon the type of RF signal and the portion of the envelope that can be amplified by the class S modulator. Consequently, both change as the number and types of signals to be transmitted change.

Class B amplifiers are most efficient when the peak amplitude of the signal matches the maximum output of the amplifier. Conventional split band modulators utilize fixed supply voltages. Since the supply voltage must be large enough to accommodate the largest possible signal, in conventional split band modulators the class B amplifier operates at less than the maximum possible efficiency for all other signals.

Adaptive split band modulator 270 efficiently amplifies a bandwidth which is larger than can be efficiently amplified by class S modulator 760 alone. In addition, adaptive split band modulator 270 amplifies this larger bandwidth more efficiently than a conventional split band modulator. The adaptive components, including peak detector 730 and voltage regulator 740, operate to increase the efficiency of the high frequency path beyond that of a conventional split band modulator.

The foregoing description of adaptive split band modulator 270 has set forth the use of a class S modulator to amplify the low frequency components, and a class B amplifier to amplify the high frequency components. Additionally, the supply voltage of the class B amplifier is adaptively modified to increase the efficiency of the class B amplifier. The class S modulator and class B amplifier are meant to be exemplary and are not the only types of amplifiers that can be advantageously used while practicing the present invention. In alternate embodiments, amplifier types other than class S are used for amplifying the low frequency components, and amplifier types other than class B are used for amplifying the high frequency components.

This advantageous circuit arrangement which provides high efficiency amplification over a wider bandwidth, provides many advantages. One advantage includes the ability to amplify a larger modulation bandwidth thereby allowing the efficient amplification of larger RF bandwidths in an EER-type amplifier.

Figure 3:
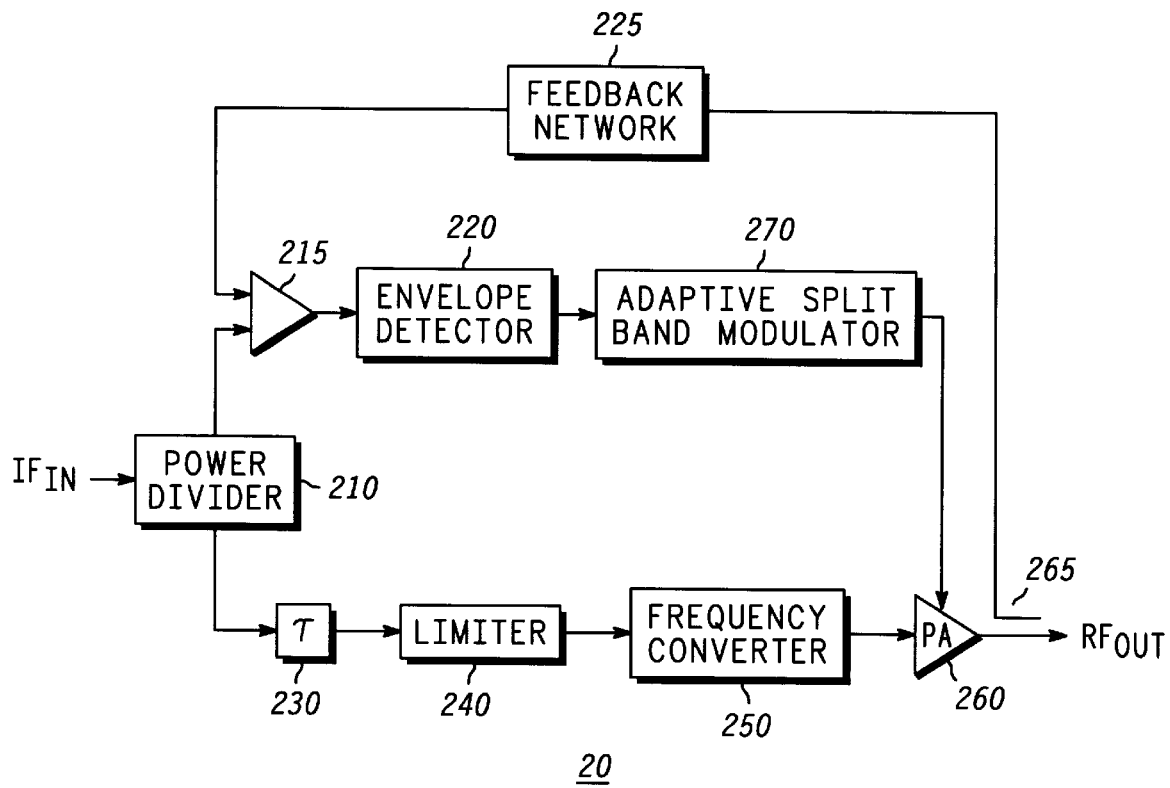
FIG. 3 shows an amplifier in accordance with an alternate embodiment of the present invention.

FIG. 3 shows an amplifier in accordance with an alternate embodiment of the present invention. In FIG. 3 an intermediate frequency (IF) signal is shown as the input signal to EER-type amplifier 20. The IF signal is input into power divider 210. Power divider 210 functions to split the input signal into the amplitude path and the phase path. The amplitude path feeds scaling amplifier 215, and the phase path feeds time delay element 230.

The amplitude path of EER-type amplifier 20 includes scaling amplifier 215, envelope detector 220, and adaptive split band modulator 270. With the exception of scaling amplifier 215, these elements correspond to the elements of FIG. 1 which have like names and like reference numbers. In addition, adaptive split band modulator 270 corresponds to adaptive split band modulator 270 of FIG. 1, which was discussed in detail previously in connection with FIG. 2.

Scaling amplifier 215 receives the peak detected signal from power divider 210, and also receives a feedback signal from feedback network 225. Feedback network 225, in turn, receives its input from coupler 265 which samples the envelope of the RF output. This feedback path, which includes coupler 265, feedback network 225, and scaling amplifier 215, helps to reduce any nonlinearities that are caused by adaptive split band modulator 270 and power amplifier 260.

Coupler 265 is used to sample the output signal for the feedback. Of course, any means for sampling the output signal could be used in place of coupler 265 while still practicing the present invention. Coupler 265 takes a sample of the RF envelope and feeds it back into the amplitude path through feedback network 225. This feedback arrangement provides the well known benefits of feedback to an amplifier operating at very high frequency without the necessity of feeding back the very high frequency signals. The bandwidth requirements of the loop are dictated by the envelope bandwidth and not the RF bandwidth, so the benefits of the feedback can continue to be realized as the RF signals increase in frequency.

Feedback network 225 is analog or digital, but is preferably analog. Feedback network 225 includes circuits known in the art such as attenuators. Scaling amplifier 215 is one of many different types of amplifiers, for example, an operational amplifier.

In the case of distortion caused by power amplifier 260, the feedback path helps reduce amplitude distortion resulting from a nonlinear amplitude transfer characteristic between the drain bias input and the output of power amplifier 260. In the case of distortion caused by adaptive split band modulator 270, the feedback path helps reduce distortions caused by the transition region between low pass filters 720 and 780 (FIG. 2), and high pass filters 710 and 770 (FIG. 2).

Significant improvements in intermodulation products can be achieved with the envelope feedback in the EER-type amplifier as shown in FIG. 3. The method and apparatus of the present invention as embodied in FIG. 3 sufficiently improve the intermodulation performance of the EER-type amplifier to allow full power, saturated operation and still meet strict adjacent channel power requirements.

The phase path of EER-type amplifier 20 includes time delay element 230, limiter 240, frequency converter 250 and power amplifier 260. Time delay element 230, limiter 240 and power amplifier 260 correspond to the elements shown in FIG. 1 with like names and like reference numbers. In contrast to the embodiment shown in FIG. 1, the alternate embodiment of FIG. 3 includes frequency converter 250 in the phase path. Frequency converter 250 receives the signal in the phase path and also receives a local oscillator (LO) signal. Frequency converter 250 converts the frequency of the carrier signal to its final RF frequency using circuitry well known in the art, such as a mixer. The resulting signal is then used to drive power amplifier 260 which operates at the final RF frequency.

Because of the operation of frequency converter 250, the amplifier of FIG. 3 takes in a signal at a frequency different from the final RF frequency. FIG. 3 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 3, the input signal can be at any frequency different from the RF frequency.

In this circuit arrangement, with frequency converter 250 being an integral part of the amplifier, the amplifier becomes more tightly integrated with the device that houses the amplifier. Tighter integration results in smaller, lower power devices, which are easier to manufacture.

The feedback path and the frequency conversion as shown in FIG. 3 do not need to be implemented together. That is, the amplifier of FIG. 3 could be implemented with frequency conversion and without the feedback, or conversely, the amplifier of FIG. 3 could be implemented with the feedback and without the frequency conversion.

Figure 4:
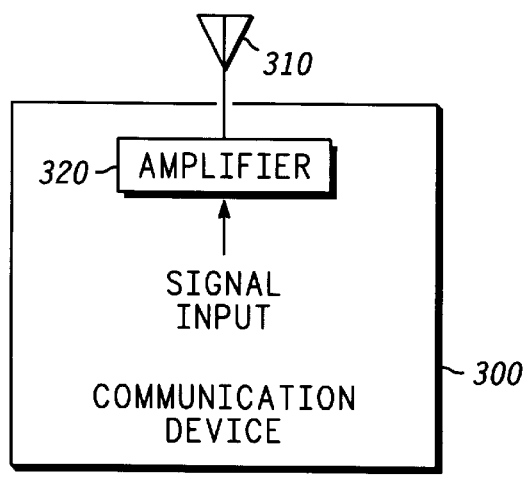
FIG. 4 shows a diagram of a communications device in accordance with a preferred embodiment of the present invention.

FIG. 4 shows a diagram of a communications device in accordance with a preferred embodiment of the present invention. Communications device 300 includes amplifier 320 and antenna 310. Amplifier 320 may comprise any of the amplifiers of the present invention, including for example, EER-type amplifier 10 (FIG. 1), adaptive split band modulator 270 (FIG. 2), or EER-type amplifier 20 (FIG. 3). Communications device 300 may be one of many different devices capable of communications. Examples include, but are not limited to, subscriber units in a communications system, radio receivers, transmitters, and transceivers, one-way and two-way pagers, and cellular phones.

Figure 5:
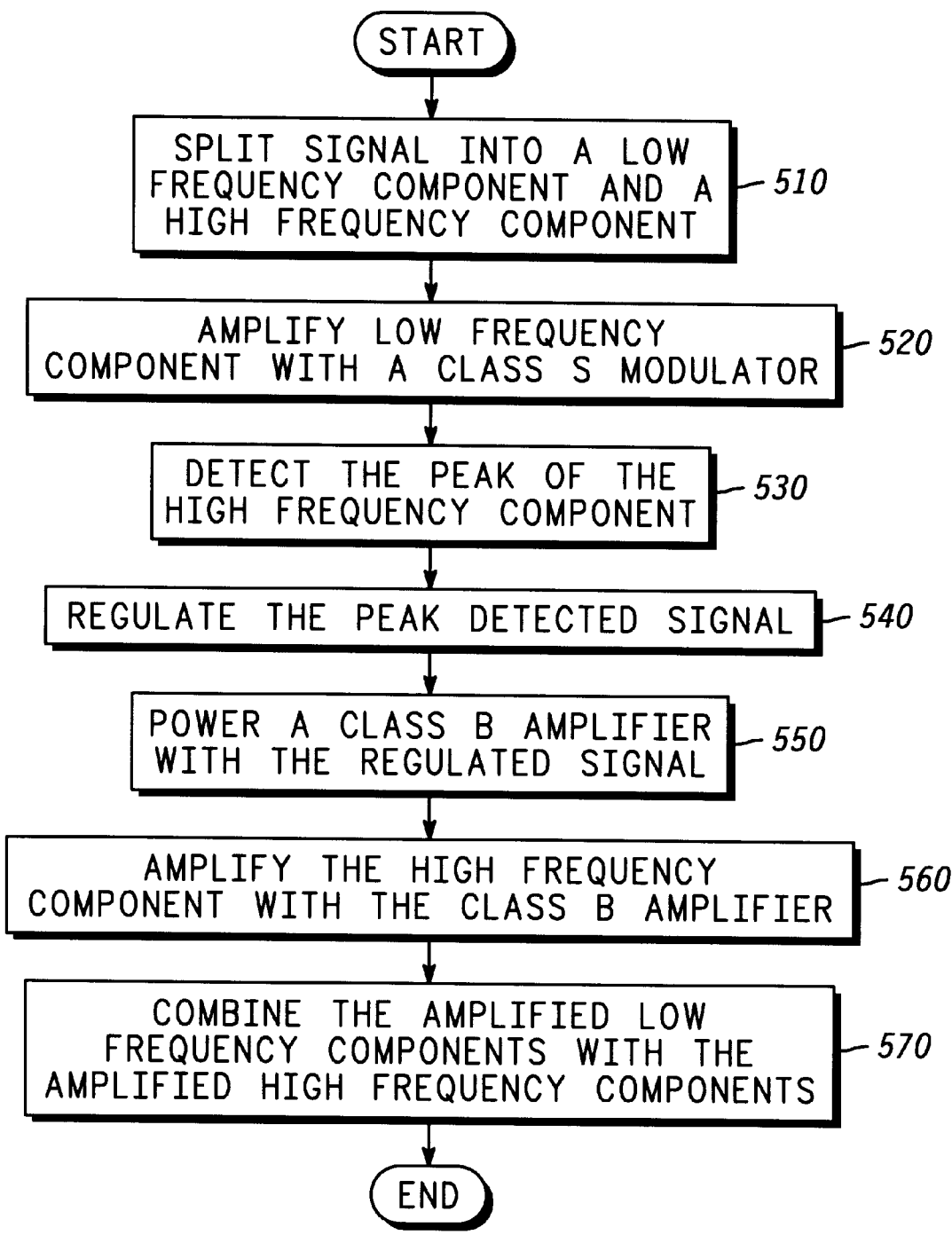
FIG. 5 shows a flow chart for a method of amplifying a signal in accordance with a preferred embodiment of the present invention.

FIG. 5 shows a flow chart for a method of amplifying a signal in accordance with a preferred embodiment of the present invention. In step 510 an input signal is split into two components: a low frequency component and a high frequency component. A signal can be split into low and high frequency components using a variety of means. One possibility is the use of passive filters. With the low frequency component separated from the high frequency component, the two components can be modified without affecting the other. Specifically, they can be amplified using different means.

After the input signal is split into two separate components, the low frequency component is amplified using a class S modulator in step 520. The class S modulator amplifies the signal by creating a pulse width modulated signal having a duty cycle proportional to the amplitude of the low frequency component of the input signal. The pulsewidth modulated signal is then low pass filtered to create an amplified replica of the input signal.

Then, in step 530, the peak of the high frequency component is detected. The peak of high frequency component is regulated in step 540, and the resulting regulated peak signal is used to power a class B amplifier in step 550.

Then, in step 560, the class B amplifier is used to amplify the high frequency components. After the low frequency components have been amplified in the class S modulator and the high frequency components have been amplified in the class B amplifier, the resulting amplified components are combined together in step 570 to produce an amplified replica of the original signal.

In summary, the method and apparatus of the present invention as described provide a versatile way of achieving efficient amplification of a signal with a large RF bandwidth and a correspondingly large modulation bandwidth. Embodiments of an EER-type amplifier which utilizes an adaptive split band modulator have been described. The adaptive split band modulator efficiently amplifies a wideband envelope and allows the EER-type amplifier to efficiently amplify a wideband RF signal having a correspondingly wideband modulation bandwidth.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, peak detector 730 and voltage regulator 740 could be combined, or power amplifier 260 could be comprised of multiple stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying an input signal, said method comprising:

splitting said input signal into a low frequency component and a high frequency component;

amplifying said low frequency component with a first amplifier to produce an amplified low frequency component;

setting a supply voltage of a second amplifier as a function of an amplitude of said high frequency component;

amplifying said high frequency component with said second amplifier to produce an amplified high frequency component; and combining said amplified low frequency component and said amplified high frequency component.

2. The method of claim 1 wherein setting a supply voltage of a second amplifier as a function of an amplitude of said high frequency component comprises:

peak detecting said high frequency component to produce a peak detected signal;

regulating said peak detected signal to produce a regulated signal; and setting said supply voltage of said second amplifier with said regulated signal.

3. The method of claim 1 wherein said first amplifier comprises a class S modulator.

4. The method of claim 1 wherein said second amplifier comprises a class B amplifier.

5. The method of claim 1 wherein said combining said amplified low frequency component and said amplified high frequency component comprises:

low pass filtering said amplified low frequency component to produce a low pass filtered signal;

high pass filtering said amplified high frequency component to produce a high pass filtered signal; and combining said low pass filtered signal with said high pass filtered signal.

6. The method of claim 1 wherein said step of amplifying said low frequency component with a first amplifier to produce an amplified low frequency component comprises:

producing a pulsewidth modulated signal with a duty cycle proportional to an amplitude of said low frequency component; and low pass filtering said pulsewidth modulated signal to produce said amplified low frequency component.

7. An apparatus for efficiently amplifying an input signal, said apparatus comprising:
- a power amplifier stage for amplifying said input signal, said power amplifier stage having a drain bias input;
- an envelope detector for detecting an envelope of said input signal; and
- an adaptive split band modulator for amplifying said envelope of said input signal, said adaptive split band modulator having an output which drives said drain bias input of said power amplifier stage;
- a first amplifier having an input coupled to an input of said adaptive split band modulator;
- a peak detector having an input coupled to said input of said adaptive split band modulator;
- a second amplifier having an input coupled to said input of said adaptive split band modulator, and having a power supply input coupled to an output of said peak detector; and
- a combining network for combining an output of said first amplifier and an output of said second amplifier.

8. The apparatus of claim 7 wherein said first amplifier comprises a class S modulator.

9. The apparatus of claim 7 wherein said second amplifier comprises a class B amplifier.

10. The apparatus of claim 7 further comprising a limiter which amplitude limits said input signal prior to said power amplifier stage.

11. The apparatus of claim 7 further comprising a voltage regulator coupled between said peak detector and said power supply input of said second amplifier.

12. The apparatus of claim 7 further comprising:
- a coupler coupled to an output of said power amplifier stage;
- a feedback network responsive to said coupler; and
- a scaling amplifier coupled between said envelope detector and said adaptive split band modulator, where said scaling amplifier is responsive to said feedback network and said envelope of said input signal.

* * * * *